US009933664B2

(12) United States Patent
Jiang et al.

(10) Patent No.: US 9,933,664 B2
(45) Date of Patent: Apr. 3, 2018

(54) DISPLAY PANEL AND ENCAPSULATION METHOD THEREOF, AND LIQUID CRYSTAL DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Qinghua Jiang, Beijing (CN); Feng Qin, Beijing (CN); Xiaohe Li, Beijing (CN); Yong Liu, Beijing (CN); Xianjie Shao, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 244 days.

(21) Appl. No.: 14/384,969

(22) PCT Filed: Dec. 10, 2013

(86) PCT No.: PCT/CN2013/089004
§ 371 (c)(1),
(2) Date: Sep. 12, 2014

(87) PCT Pub. No.: WO2015/014066
PCT Pub. Date: Feb. 5, 2015

(65) Prior Publication Data
US 2015/0055041 A1  Feb. 26, 2015

(30) Foreign Application Priority Data
Jul. 30, 2013  (CN) .......................... 2013 1 0325110

(51) Int. Cl.
*G02F 1/1339* (2006.01)
*H01L 27/12* (2006.01)
(Continued)

(52) U.S. Cl.
CPC ........ *G02F 1/1339* (2013.01); *H01L 27/1214* (2013.01); *H01L 27/1259* (2013.01);
(Continued)

(58) Field of Classification Search
None
See application file for complete search history.

(56) References Cited

U.S. PATENT DOCUMENTS 6,473,147 B1 * 10/2002 Nakahara ............. G02F 1/1339
349/149
2002/0163614 A1 * 11/2002 Hinata .................. G02F 1/1339
349/139
(Continued)

FOREIGN PATENT DOCUMENTS

CN  102540595 A  7/2012
CN  103389588 A  11/2013
(Continued)

OTHER PUBLICATIONS

International Preliminary Report on Patentability Appln. No. PCT/CN2013/089004; dated Feb. 2, 2016.
(Continued)

*Primary Examiner* — Edward Glick
*Assistant Examiner* — Shan Liu
(74) *Attorney, Agent, or Firm* — Ladas & Parry LLP (57) ABSTRACT

A display panel and an encapsulation method thereof, and a liquid crystal display device are provided. The display panel comprises an array substrate and a color filter substrate, the array substrate and the color filter substrate are connected together via a sealant component, the array substrate com-
(Continued)

prises a display region and a peripheral region surrounding the display region, the sealant component comprises insulating sealant and conductive sealant and is disposed in the peripheral region of the array substrate, a gate electrode driving GOA circuit is disposed in the peripheral region of the array substrate, and the gate electrode driving GOA circuit and the conductive sealant are not located on the same side of the peripheral region of the display region.

12 Claims, 5 Drawing Sheets

(51) Int. Cl.
  *G02F 1/1333* (2006.01)
  *G02F 1/1345* (2006.01)
(52) U.S. Cl.
  CPC .............. *G02F 1/1345* (2013.01); *G02F 2001/133388* (2013.01); *G02F 2202/16* (2013.01)

(56) References Cited

U.S. PATENT DOCUMENTS

| | | | | |
|---|---|---|---|---|
| 2005/0062687 | A1* | 3/2005 | Muramatsu | G02F 1/1345 345/55 |
| 2005/0248711 | A1* | 11/2005 | Miyazaki | G02F 1/1339 349/153 |
| 2006/0139556 | A1* | 6/2006 | Ahn | G02F 1/13394 349/153 |
| 2006/0139563 | A1* | 6/2006 | Momose | G02F 1/134336 349/190 |
| 2007/0164954 | A1* | 7/2007 | Yang | G09G 3/3677 345/88 |
| 2007/0182909 | A1* | 8/2007 | Kim | G02F 1/1345 349/149 |
| 2008/0151350 | A1* | 6/2008 | Tonar | B32B 17/06 359/267 |
| 2011/0051072 | A1* | 3/2011 | Lee | G02F 1/1339 349/190 |
| 2012/0153814 | A1 | 6/2012 | Lee et al. | |

FOREIGN PATENT DOCUMENTS

| | | |
|---|---|---|
| JP | 2006184382 A | 7/2006 |
| KR | 20010073679 A | 8/2001 |
| TW | 201227680 A | 7/2012 |

OTHER PUBLICATIONS

First Chinese Office Action Appln. No. 201310325110.0; dated Jun. 11, 2015.

International Search Report Appln. No. PCT/CN2013/089004; dated Apr. 30, 201.

* cited by examiner

DISPLAY PANEL AND ENCAPSULATION METHOD THEREOF, AND LIQUID CRYSTAL DISPLAY DEVICE

TECHNICAL FIELD

Embodiments of the present invention relate to a display panel and an encapsulation method thereof, and a liquid crystal display device.

BACKGROUND

With constant development of thin film transistor liquid crystal display (TFT-LCD), user's requirements for a narrow bezel of a display are getting higher and higher. To further reduce a width of the display bezel, currently a Gate-On-Array (GOA) circuit is generally fabricated on a TFT substrate in the industry. In this way, a gate electrode driving chip (IC) becomes not only unnecessary, but also a very narrow bezel can be realized. The display bezel using a gate electrode driving chip IC is generally 5 mm or more, and the display bezel for the TFT substrate driven by the GOA circuit is generally less than 3 mm.

Figure 1:
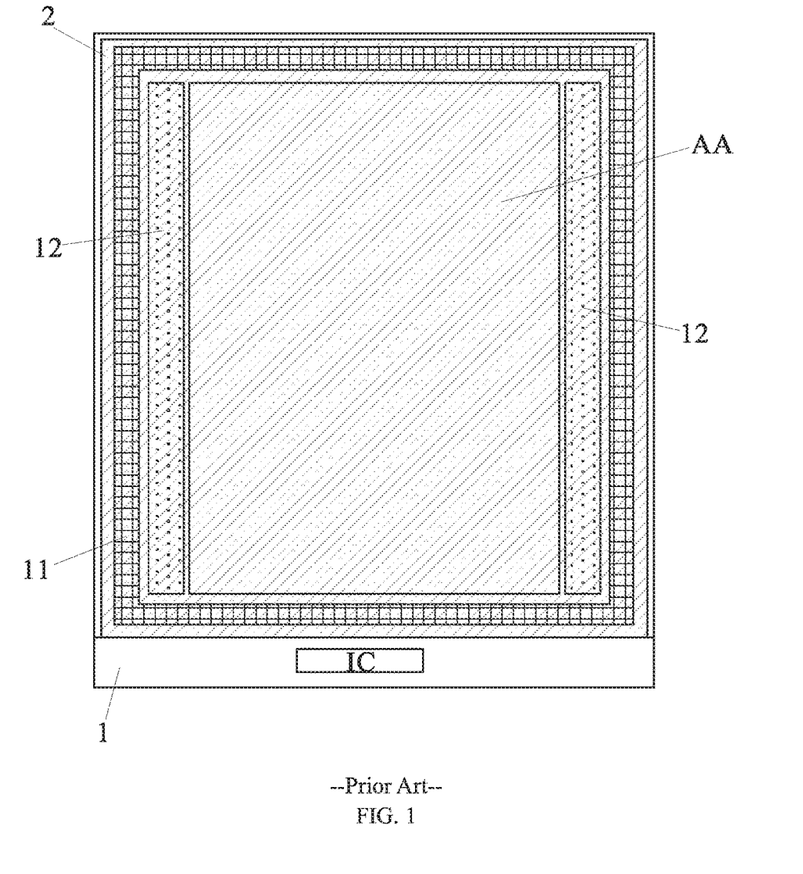
FIG. 1 is a structural schematic diagram of a display panel in the prior art.

The structure of the TFT display panel driven by the GOA circuit may be shown in FIG. 1, in which a TFT substrate 1 is provided on a bottommost layer, on which a signal line driving chip IC is pressure welded, a color filter (CF) substrate 2 is provided on a topmost layer, with a liquid crystal layer interposed therebetween (not shown in FIG. 1). A solid-line box AA indicates an effective display region; the TFT substrate 1 and the CF substrate 2 are attached together with a layer of sealant 11 interposed between them to prevent leakage of the internal liquid crystal; there are two sets of GOA circuits 12 within the region enclosed by the sealant 11, and the two sets of GOA circuit 12 are symmetrically disposed on both sides of the AA region, for progressive scanning the gate lines in the display region; in order to further reduce a bezel width of the display panel, as shown in FIG. 1, a distance between the sealant 11 and an edge of the panel and a distance between the sealant 11 and the GOA circuit 12 are usually small.

Figure 2:
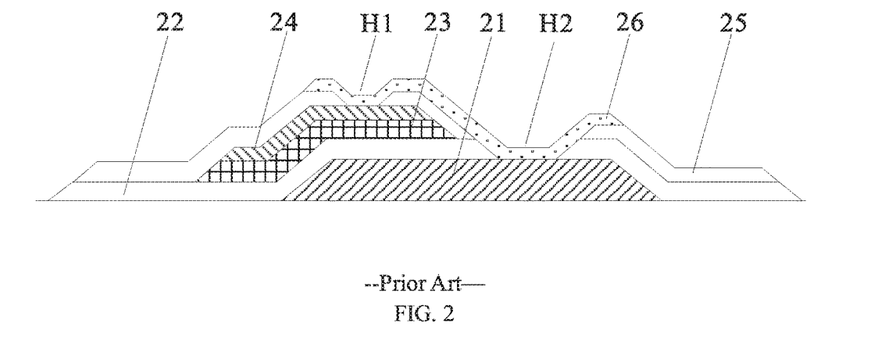
FIG. 2 is a cross-sectional structural schematic diagram of an array substrate of a display panel in the prior art.
Figure 3:
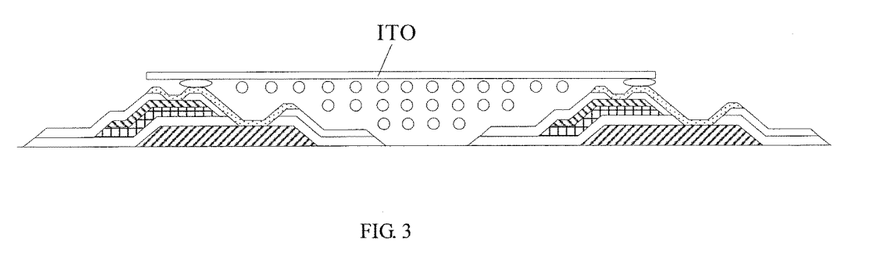
FIG. 3 is a schematic diagram of an existing display panel in a case of short circuit.

For a display panel of active-matrix driving type, there is provided a conductive ITO thin film on the surface of CF substrate, which surface is close to the liquid crystal layer, as a common electrode; and the common electrode and a pixel electrode on the surface of the TFT substrate constitute an electric field structure, to drive the liquid crystal between the two substrates to deflect. It should be specially noted that, charges of the common electrode on the CF substrate are usually derived from the charges on the TFT substrate that are transferred via conductive particles within the sealant. However, there are some gate lines connected with data lines in the GOA circuit structure, and the cross-sectional view thereof is shown in FIG. 2, in which 21 indicates a gate line layer metal, 22 indicates a gate insulating layer, 23 indicates a semiconductor layer, 24 indicates a data line layer metal, 25 indicates a passivation layer, and 26 indicates a pixel electrode ITO layer; and a via-hole H1 connects the pixel electrode ITO layer 26 with the data line layer metal 24, a via-hole H2 connects the pixel electrode ITO layer 26 with the gate line layer metal 21, so as to implement connection between the gate line layer metal 21 and the data line layer metal 24. Because there are provided some such via-holes within the TN-type liquid crystal display panel GOA circuits, the sealant which binds the TFT substrate and the CF substrate together must be isolated from the GOA circuits, otherwise the conductive particles within the sealant will make all the ITO layers in the GOA short-circuited via the common electrode ITO on the CF substrate, as shown in FIG. 3. In the fabrication process of a narrow-bezel display panel of TN type, since a distance between the sealant and the GOA circuit is too small, it is difficult to completely isolate the sealant from the GOA circuit in the traditional design, making it difficult to avoid electrode short-circuit, which affects display effect of the display panel, and severely restricts narrow-bezel design for the TN-type display panel.

SUMMARY

An embodiment of the present invention provides a display panel, comprising an array substrate and a color filter substrate, the array substrate and the color filter substrate are connected together via a sealant component, the array substrate comprises a display region and a peripheral region surrounding the display region, the sealant component comprises insulating sealant and conductive sealant and is disposed in the peripheral region of the array substrate, a gate electrode driving GOA circuit is disposed in the peripheral region of the array substrate, and the gate electrode driving GOA circuit and the conductive sealant are not located on the same side of the peripheral region of the display region.

In one example, the peripheral region comprises a first encapsulation region adjacent to a first side of the display region and a second encapsulation region adjacent to a second side of the display region which is different from the first side, the gate electrode driving GOA circuit is disposed within the first encapsulation region, and the conductive sealant is disposed in the second encapsulation region.

In one example, the first side and the second side of the display region are adjacent to each other.

In one example, the insulating sealant is formed in the first encapsulation region and/or the second encapsulation region.

In one example, the insulating sealant is formed directly on a surface of the GOA circuit.

In one example, the insulating sealant is formed to surround the display region, and the insulating sealing frame is not in contact with the display region.

In one example, in the second encapsulation region, the conductive sealant is formed on a surface of the insulating sealant; or, in the second encapsulation region, the conductive sealant is formed outside the insulating sealant.

In one example, the array substrate comprises a driving chip disposed in the second encapsulation region; and the conductive sealant is formed between the display region and the driving chip.

Another embodiment of the present invention provides a liquid crystal display device, comprising any of the above-described display panels.

Still another embodiment of the present invention provides an encapsulation method of a display panel, comprising: providing an array substrate and a color filter substrate, the array substrate comprising a display region and a peripheral region surrounding the display region, wherein a gate electrode driving GOA circuit is disposed in a peripheral region of the array substrate; and providing a sealant component comprising conductive sealant and insulating sealant on the array substrate or the color filter substrate for connecting the array substrate and the color filter substrate, the sealant component being disposed to correspond to the peripheral region of the array substrate, wherein the conductive sealant electrically connects the array substrate and the color filter substrate, and is not located on the same side of the display region as the gate electrode driving GOA circuit.

In one example, providing a sealant component comprising conductive sealant and insulating sealant on the array substrate and/or the color filter substrate for connecting the array substrate and the color filter substrate comprises: directly forming the insulating sealant on a surface of the GOA circuit region.

In one example, the insulating sealant is formed to surround the display region, and the insulating sealant is not in contact with the display region.

In one example, the peripheral region of the array substrate comprises a first encapsulation region adjacent to a first side of the display region and a second encapsulation region adjacent to a second side of the display region which is different from the first side, the gate electrode driving GOA circuit being disposed within the first encapsulation region, the conductive sealant being disposed in the second encapsulation region, and wherein providing a sealant component comprising conductive sealant and insulating sealant on the array substrate and/or the color filter substrate for connecting the array substrate and the color filter substrate comprises: in the second encapsulation region of the array substrate, forming the conductive sealant on a surface of the insulating sealant; or in the second encapsulation region of the array substrate, forming the conductive sealant outside the insulating sealant.

In one example, the array substrate comprises a driving chip disposed in the second encapsulation region; and providing a sealant component comprising conductive sealant and insulating sealant on the array substrate and/or the color filter substrate for connecting the array substrate and the color filter substrate comprises: forming the conductive sealant between the display region and the driving chip.

BRIEF DESCRIPTION OF THE DRAWINGS

In order to more clearly illustrate the technical solution of the embodiments of the present invention, the drawings to be used in description of the embodiments or the prior art will be briefly described in the following; it is obvious that the described drawings are only related to some embodiments of the present invention and thus are not limitative of the invention.

DETAILED DESCRIPTION

In order to make objects, technical details and advantages of the embodiments of the present invention apparent, the technical solutions of the embodiment will be described in a clearly and fully understandable way in connection with the drawings related to the embodiments of the present invention. It is obvious that the described embodiments are just a part but not all of the embodiments of the present invention. Based on the described embodiments herein, those skilled in the art can obtain other embodiment(s), without any inventive work, which should be within the scope of the present invention.

One technical issue to be solved by the embodiments of the present invention is to provide a display panel and an encapsulation method thereof, and a liquid crystal display device, which can avoid short circuit between electrodes, and implement a narrow bezel design of the display panel.

Figure 4:
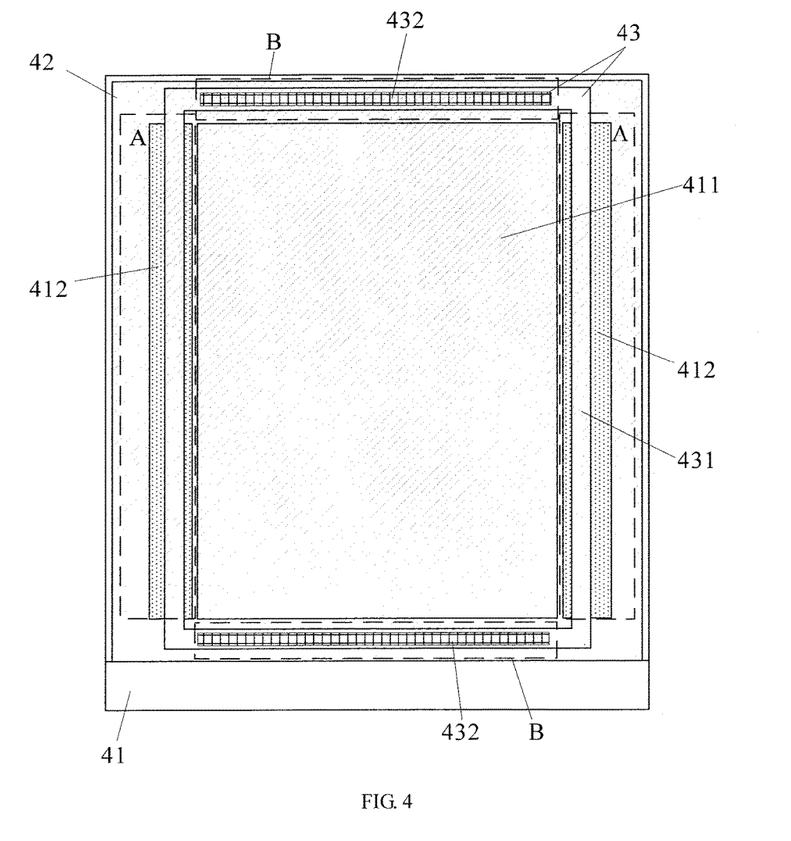
FIG. 4 is a structural schematic diagram of a display panel according to an embodiment of the present invention.

The display panel according to an embodiment of the present invention, as shown in FIG. 4, comprises: an array substrate 41 and a color filter substrate 42, the array substrate 41 and the color filter substrate 42 being bond together via a sealant component 43; the array substrate 41 comprises a display region 411 and a gate electrode driving GOA circuit 412 located outside the display region 411; furthermore, the sealant component 43 comprises: insulating sealant 431 formed in a first encapsulation region A and/or a second encapsulation region B, and conductive sealant 432 formed in the second encapsulation region B for connecting the array substrate 41 and the color filter substrate 42.

Figure 5:
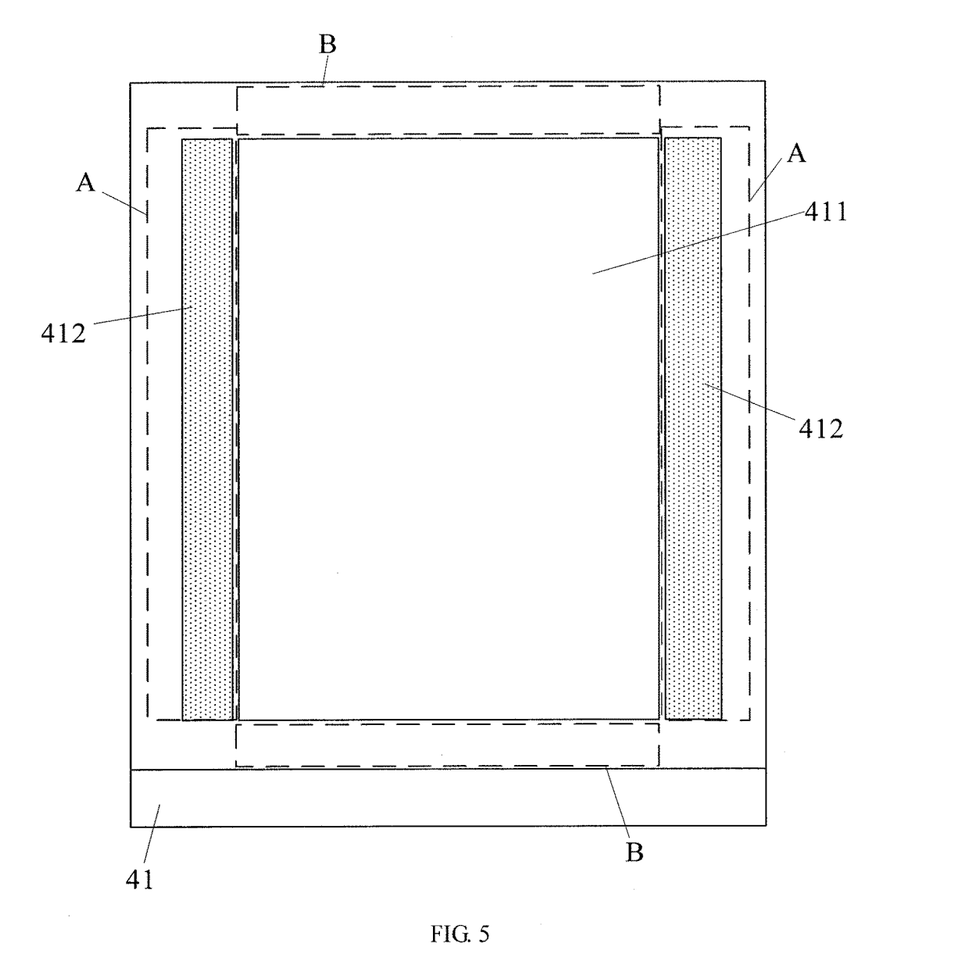
FIG. 5 is a structural schematic diagram of an array substrate without sealant being formed in a display panel of FIG. 4.

In one example, as shown in FIG. 5, the array substrate 41 comprises the display region 411 and a peripheral region outside the display region 411. The peripheral region comprises the first encapsulation region A where the GOA circuit 412 is disposed and the second encapsulation region B where the GOA circuit 412 is not disposed.

An embodiment of the present invention provides a display panel, the display panel comprising an array substrate and a color filter substrate, the array substrate and the color filter substrate are bond together with sealant; the array substrate comprises a display region and a gate electrode driving GOA circuit located outside the display region. In the encapsulation process of the display panel, the insulating sealant is respectively formed in the first encapsulation region and/or the second encapsulation region outside the display region where the GOA circuit is disposed, and the conductive sealant is formed in the second encapsulation region outside the display region where the GOA circuit is not disposed. In this way, the electrode on the color filter substrate can be powered through the conductive sealant, the conductive sealant and the GOA circuit being disposed in different regions, which can thereby effectively avoid electrode short-circuit, and significantly improve the display effect of the display panel.

It should be noted that the display panel according to the embodiment of the present invention may comprise a variety of display panels whose crystal molecules are driven by the vertical electric field, comprising a TN-type display panel. In the embodiment of the present invention, the TN-type display panel is taken as an example for description; a TN-type display panel typically comprises an array substrate and a color filter substrate disposed opposite to each other, with a liquid crystal layer filled between the array substrate and the color filter substrate; in order to drive the liquid crystal molecules to deflect, the surface on one side of the array substrate adjacent to the liquid crystal layer is provided with a pixel electrode ITO, the surface on one side of the color filter substrate adjacent to the liquid crystal layer is provided with a common electrode ITO, and the common electrode ITO and the pixel electrode ITO generate an electric field structure, driving the liquid crystal molecules between the electric field to deflect. The common electrode ITO on the color filter substrate is electrically connected with a circuit on the array substrate through the conductive sealant.

Further, in the display panel shown in FIG. 4, the insulating sealant 431 may be formed on the surface of the GOA circuit 412 region.

In one example, a width of the insulating sealant is between 0.6-1.0 mm, which is less than the width of the GOA circuit region. Compared to the case where the insulating sealant is arranged in parallel with the GOA circuit with an interval of 0.2-0.4 mm in the first encapsulation region A, in this example, the insulating sealant 431 is formed directly on the surface of the GOA circuit 412, which not only requires no additionally reserved sealant coating region outside the GOA circuit region, but also can omit the above-described interval of 0.2-0.4 mm, so that a frame width on one side can be reduced by 0.8-1.4 mm, thus a narrow bezel for a variety of display panels, comprising the TN-type display panel, can be effectively implemented.

In one example, the insulating sealant 431 may further be continuously formed in the peripheral region surrounding the display region 411, and the insulating sealant 431 is not in contact with the display region. As shown in FIG. 4, the insulating sealant 431 may be of a rectangle (box) regions equally spaced around the display region 411. Such a sealant coating mode can be fabricated with existing devices, which thereby can reduce difficulty in producing such a display panel to some extent.

It should be noted that the display panel according to an embodiment of the present invention may be provided with at least one set of the GOA circuit to implement scanning drive of a pixel circuit. For example, in one example, the display panel may comprise only one set of GOA circuit disposed on the left-side or the right-side of a display region, so as to minimize the frame design of the display panel while implementing scanning drive of the pixel circuit; or in another example, the display panel may comprise two sets of GOA circuits respectively disposed on the left-side and the right-side of the display region, the GOA circuit on the left-side may be used for scanning gate lines in odd-numbered rows, and the GOA circuit on the right-side may be used for scanning gate lines in even-numbered rows, which thereby avoids excessive density for two adjacent lines of the GOA circuit, and thus effectively improves the quality of the display panel. In the present embodiment, as shown in FIG. 4 to FIG. 7, the description is made with two sets of GOA circuit being asymmetrically disposed on the left-side and the right-side of the display region as an example.

Further, as shown in FIG. 4, when the insulating sealant 431 is continuously formed around the display region 411, the insulating sealant 431 will be formed in the second encapsulation region B. In this case, in the second encapsulation region B, the conductive sealant 432 may be formed on the surface of the insulating sealant 431. With such a structure design of the conductive sealant 432, since no new sealant coating region is added for applying the conductive sealant 432, the frame width of the display panel can be further reduced. But the deficiency may be that, by directly forming the conductive sealant 432 with conductive particles on the insulating sealant 431 without conductive particles, defects such as poor connectivity may occur, thus affecting power supply for the ITO electrode on the color filter substrate.

In one example, in order to avoid occurrence of the above-mentioned defects, the insulating sealant 431 located underneath the conductive sealant 432 in the second encapsulation region B may be provided with a via-hole, or additionally provided with a connection circuit, so that the conductive sealant 432 is connected with the control circuit on the array substrate via the via-hole or the additionally provided connection circuit.

Figure 6:
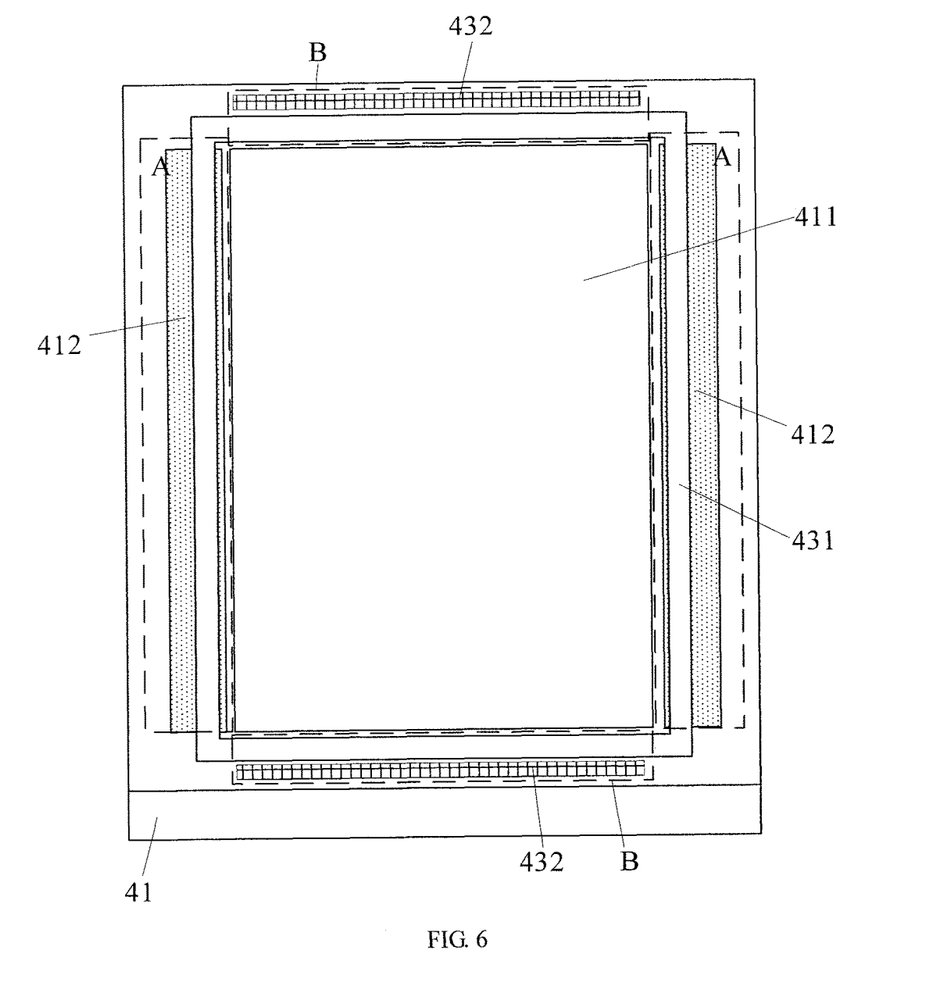
FIG. 6 is a structural schematic diagram of an array substrate in another display panel according to an embodiment of the present invention.

In order to avoid occurrence of defects such as poor connectivity by directly forming the conductive sealant 432 with conductive particles on the insulating sealant 431 without conductive particles, the display panel according to an embodiment of the present invention can be provided as shown in FIG. 6; in the second encapsulation region B, the conductive sealant 432 can be formed outside the insulating sealant 431.

For example, as shown in FIG. 5, when the box-shaped insulating sealant 431 without conductive particles has been formed on the display panel, the conductive sealant 432 with conductive particles may be formed on both the upside and downside of the display panel, on which sides the GOA circuits are not disposed, the conductive sealant 432 may be adjacently formed outside the insulating sealant 431, or the conductive sealant 432 may be disposed with a certain interval from the insulating sealant 431. In such a display panel, the position of the insulating sealant 431 and the position of the conductive sealant 432 do not overlap, which thereby can not only supply power to the ITO electrode on the color filter substrate through the conductive particles, but also can avoid short-circuit in the GOA circuit on both sides.

Figure 7:
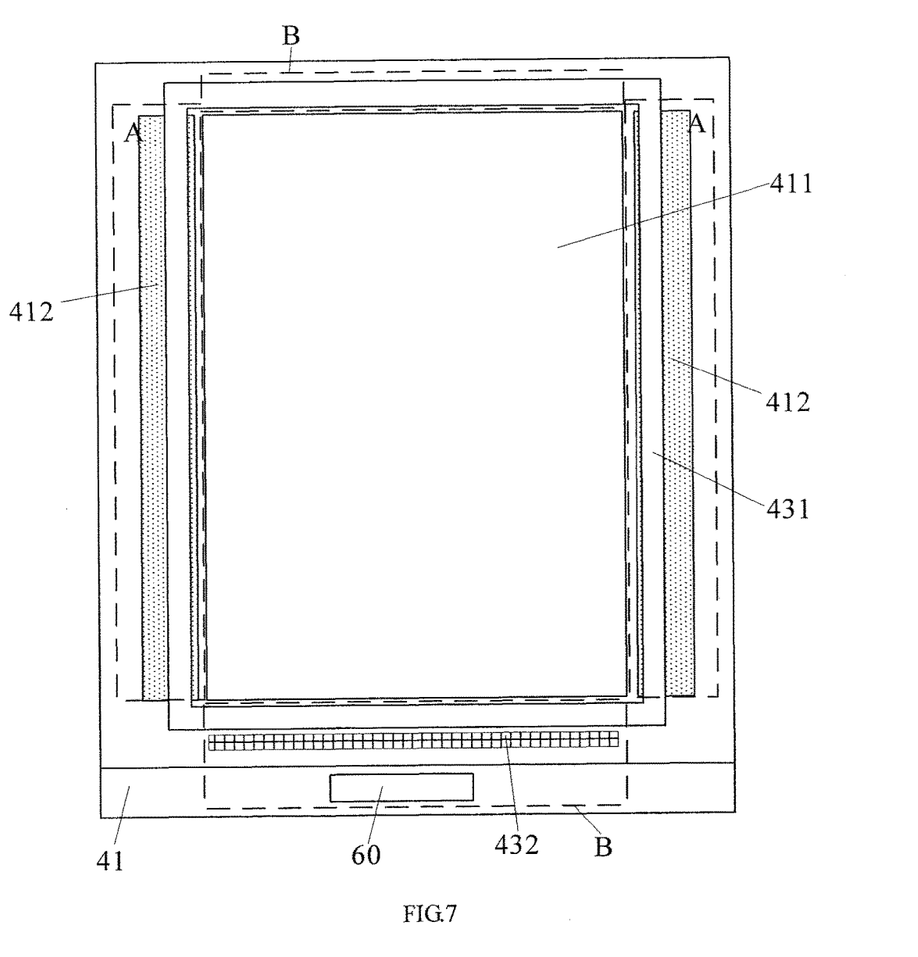
FIG. 7 is a structural schematic diagram of an array substrate in still another display panel according to an embodiment of the present invention

In one example, as shown in FIG. 7, the array substrate 41 further comprises a driving chip 60 disposed in the second encapsulation region B. The conductive sealant 432 can be formed between the display region 411 and the driving chip 60.

For example, in the display panel shown in FIG. 7, a signal line driving chip 60 is pressure welded within the peripheral region beneath the display region 411, in which region the GOA circuit 412 is not disposed, and the driving chip 60 is mainly used for controlling signal input of the gate line or the data line. In one example, on the array substrate of the display panel, the peripheral region adjacent to one side of the driving chip 60 is provided with multiple designs such as sector wiring, so as to occupy a larger width, while the opposite side is typically limited in the region area in order to meet the requirements of a narrow bezel. In this case, the conductive sealant 432 with conductive particles may be formed only on one side of the driving chip 60, the conductive sealant 432 may be located in a region between the display region 411 and the driving chip 60, and the remaining three sides are not provided with conductive sealant with conductive particles. Electrical connection of the ITO electrode on the color filter substrate is implemented in such a way that can not only supply power to the ITO electrode on the color filter substrate, but also avoid short-circuit on both sides of the GOA circuit, so as to further improve the quality of the display panel.

A liquid crystal display device, according to an embodiment of the present invention, comprises any one of the above-described display panels. The liquid crystal display device may be a liquid crystal display, a liquid crystal display Television, a digital photo-frame, a mobile phone or a tablet personal computer, and any other product or component with a display function.

It should be noted that the display panel, for example, may comprise a variety of display panels, crystal molecules of which are driven by a vertical electric field, comprising a TN-type display panel. In an embodiment of the present invention, the TN-type display panel is taken as an example for description; the TN-type display panel typically comprises an array substrate and a color filter substrate disposed opposite to each other, with a liquid crystal layer filled between the array substrate and the color filter substrate; in order to drive the liquid crystal molecules to deflect, the surface on one side of the array substrate adjacent to the liquid crystal layer is provided with a pixel electrode ITO, the surface on one side of the color filter substrate adjacent to the liquid crystal layer is provided with a common electrode ITO, and the ITO common electrode and the pixel electrode ITO generate an electric field structure, driving the liquid crystal molecules between the electric field to deflect. Therein, the common electrode ITO on the color filter substrate is electrically connected with a circuit on the array substrate through the conductive sealant.

The structure of the display panel has been described in detail in the above-described embodiments, which will not be repeated here.

The liquid display device, according to the embodiment of the present invention, comprises a display panel, the display panel comprising an array substrate and a color filter substrate, the array substrate and the color filter substrate are bond with sealant, wherein, the array substrate comprises a display region and a gate electrode driving GOA circuit located outside the display region. In the encapsulation process of the display panel, insulating sealant is formed respectively in a first encapsulation region A and/or a second encapsulation region B where the GOA circuit is disposed, and conductive sealant is formed in a second encapsulation region B where the GOA circuit is not disposed. In this way, the electrode on the color filter substrate can be powered through the conductive sealant, and the conductive sealant and the GOA circuit are disposed in different regions, which can thereby effectively avoids electrode short circuit, and significantly improve display effect of the display panel.

An embodiment of the present invention provides an encapsulation method of a display panel, applicable to any one of the above-described display panel, the method comprising:

S101: providing an array substrate and a color filter substrate, the array substrate comprising a display region and a gate electrode driving GOA circuit outside the display region.

S102: forming insulating sealant in a first encapsulation region and/or a second encapsulation region of the array substrate, the first encapsulation region comprising a region on at least one side outside the display region where a GOA circuit is disposed.

S103: forming conductive sealant for connecting the array substrate and the color filter substrate in the second encapsulation region of the array substrate, the second encapsulation region comprising a region outside the display region where the GOA circuit is not disposed.

S104: binding the color filter substrate and the array substrate by using the conductive sealant and the insulating sealant.

In the encapsulation method of the display panel according to an embodiment of the present invention, during the encapsulation process of the display panel, the insulating sealant is formed respectively via the first encapsulation region and/or the second encapsulation region outside the display region where the GOA circuit is disposed, and the conductive sealant is formed in the second encapsulation region outside the display region where the GOA circuit is not disposed. In this way, the electrode on the color filter substrate can be powered through the conductive sealant, and the conductive sealant and the GOA circuit are disposed in different regions, which can thereby effectively avoid electrode short circuit, and significantly improve display effect of the display panel.

It should be noted that the display panel, for example, may comprise a variety of display panels, crystal molecules of which are driven by a vertical electric field, comprising a TN-type display panel. In an embodiment of the present invention, the TN-type display panel is taken as an example for description; the TN-type display panel typically comprises an array substrate and a color filter substrate disposed opposite to each other, with a liquid crystal layer filled between the array substrate and the color filter substrate; in order to drive the liquid crystal molecules to deflect, the surface on one side of the array substrate adjacent to the liquid crystal layer is provided with a pixel electrode ITO, the surface on one side of the color filter substrate adjacent to the liquid crystal layer is provided with a common electrode ITO, the common electrode ITO and the pixel electrode ITO generate an electric field structure, driving the liquid crystal molecules between the electric field to deflect. Therein, the common electrode ITO on the color filter substrate is electrically connected with a circuit on the array substrate through the conductive sealant.

Further, the forming insulating sealant in a first encapsulation region and/or a second encapsulation region on the array substrate may specifically comprise: forming the insulating sealant on the surface of the GOA circuit.

In one example, a width of the insulating sealant is between 0.6-1.0 mm, which width is less than the width of the GOA circuit region. Compared to the case where the insulating sealant is arranged in parallel with the GOA circuit with an interval of 0.2-0.4 mm in the first encapsulation region A, in this example, the insulating sealant 431 is formed directly on the surface of the GOA circuit 412, which not only requires no additionally reserved sealant coating region outside the GOA circuit region, but also can omit the above-described interval of 0.2-0.4 mm, so that a frame width on one side can be reduced by 0.8-1.4 mm, so as to effectively implement the narrow bezel of a variety of display panels, comprising the TN-type display panel.

In one example, the insulating sealant 431 may further be continuously formed in the peripheral region surrounding the display region, and the insulating sealant is not in contact with the display region. Such a sealant coating mode can be realized with existing devices, which can thereby reduce difficulty in producing such a display panel to some extent.

It should be noted that at least one set of GOA circuit may be disposed in the peripheral region of the array substrate in the display panel to implement scanning drive of a pixel circuit. For example, the display panel may comprise one set of GOA circuit disposed on the left-side or the right-side of the display region, so as to minimize frame design of the display panel while implementing scanning drive of the pixel circuit; or the display panel may comprise two sets of GOA circuits respectively disposed on the left-side and the right-side of the display region, the GOA circuit on the left-side may be used for scanning gate lines in odd-numbered rows, and the GOA circuit on the right-side may be used for scanning gate lines in even-numbered rows, which thereby avoids excessive density for two adjacent lines of the GOA circuit, and thus effectively improves quality of the display panel. In the embodiment of the present invention, description is made with two sets of GOA circuits being asymmetrically disposed on the left-side and the right-side of the display region as an example.

Further, forming conductive sealant for connecting the array substrate and the color filter substrate in the second encapsulation region of the array substrate may comprise: forming the conductive sealant on the surface of the insulating sealant, in the second encapsulation region of the array substrate.

With such a structure design of the conductive sealant, since no new sealant coating region is added, the frame width of the display panel can be further reduced. But the deficiency may be that, by directly forming the conductive sealant with conductive particles on the insulating sealant without conductive particles, defects such as poor connectivity may occur, so as to affect power supply of the ITO electrode on the color filter substrate. In order to avoid occurrence of such defects, the insulating sealant in the second encapsulation region may be provided with a via-hole, or additionally provided with a connection circuit, so that the conductive sealant is connected with the control circuit on the array substrate via the via-hole or the additionally provided connection circuit.

In one example, the conductive sealant may also be formed outside the insulating sealant in the second encapsulation region of the array substrate. In such a display panel, a position of the insulating sealant and a position of the conductive sealant do not overlap, which thereby can not only supply power to the ITO electrode on the color filter substrate through conductive particles, but also can avoid short-circuit in the GOA circuit on both sides.

In one example, the array substrate may further comprise a driving chip disposed in the second encapsulation region; in such case, forming conductive sealant for connecting the array substrate and the color filter substrate in the second encapsulation region of the array substrate may comprise: only forming the conductive sealant between the display region and the driving chip. In this way, not only the ITO electrode on the color filter substrate can be powered through conductive particles, but also short-circuit on both sides of the GOA circuit can be avoided, and meanwhile, the increase in frame dimension of the display panel can be minimized, so as to further improve quality of the display panel.

Although the present invention has been described in detail with general explanation and specific embodiments above, it is obvious to those skilled in the art to make some modifications or improvements thereto on the basis of the present invention. Therefore, these modifications or improvements without departing from the spirit of the present invention all belong to the protection scope claimed by the present invention.

The invention claimed is:

1. A display panel comprising an array substrate and a color filter substrate, the array substrate and the color filter substrate being connected together via a sealant component, the array substrate comprising a display region and a peripheral region surrounding the display region, the sealant component comprising insulating sealant and conductive sealant and being disposed in the peripheral region of the array substrate, at least two gate electrode driving GOA circuits being disposed in the peripheral region of the array substrate and being disposed on opposite sides of the display region, and the at least two gate electrode driving GOA circuits and the conductive sealant being not located on the same side of the peripheral region of the display region, wherein the insulating sealant is formed directly on a surface of each of the at least two gate electrode driving GOA circuits, wherein the conductive sealant is adjacently formed outside the insulating sealant without contacting the insulating sealant, and wherein the conductive sealant is formed on both an upper side of the display panel and a lower side of the display panel, on which sides the at least two gate electrode driving GOA circuits are not disposed.

2. The display panel according to claim 1, wherein the peripheral region comprises a first encapsulation region adjacent to a first side of the display region and a second encapsulation region adjacent to a second side of the display region which is different from the first side, the at least two gate electrode driving GOA circuits are disposed within the first encapsulation region, and the conductive sealant is disposed in the second encapsulation region.

3. The display panel according to claim 2, wherein the first side and the second side of the display region are adjacent to each other.

4. The display panel according to claim 3, wherein the insulating sealant is formed in the first encapsulation region and/or the second encapsulation region.

5. The display panel according to claim 2, wherein the insulating sealant is formed in the first encapsulation region and/or the second encapsulation region.

6. The display panel according to claim 2, wherein, in the second encapsulation region, the conductive sealant is formed on a surface of the insulating sealant; or,
in the second encapsulation region, the conductive sealant is formed outside the insulating sealant.

7. The display panel according to claim 2, wherein the insulating sealant is formed to surround the display region, and the insulating sealant is not in contact with the display region.

8. The display panel according to claim 1, wherein the insulating sealant is formed to surround the display region, and the insulating sealant is not in contact with the display region.

9. A liquid crystal display device comprising the display panel according to claim 1.

10. An encapsulation method of a display panel, comprising:
providing an array substrate and a color filter substrate, the array substrate comprising a display region and a peripheral region surrounding the display region, wherein at least two gate electrode driving GOA circuits are disposed in a peripheral region of the array substrate, and are disposed on opposite sides of the display region; and
providing a sealant component comprising conductive sealant and insulating sealant on the array substrate or the color filter substrate for connecting the array substrate and the color filter substrate, the sealant component being disposed to correspond to the peripheral region of the array substrate, wherein the insulating sealant being directly formed on a surface of each of the at least two gate electrode driving GOA circuits, and the conductive sealant electrically connects the array substrate and the color filter substrate, and is not located on the same side of the display region as the at least two gate electrode driving GOA circuits, wherein the conductive sealant is adjacently formed outside the insulating sealant without contacting the insulating sealant, and wherein the conductive sealant is formed on both an upper side of the display panel and a lower side of the display panel, on which sides the at least two gate electrode driving GOA circuits are not disposed.

11. The encapsulation method of the display panel according to claim 10, wherein the insulating sealant is formed to surround the display region, and the insulating sealant is not in contact with the display region.

12. The encapsulation method of the display panel according to claim 10, wherein the peripheral region of the array substrate comprises a first encapsulation region adjacent to a first side of the display region and a second encapsulation region adjacent to a second side of the display region which is different from the first side, the at least two gate electrode driving GOA circuits are disposed within the first encapsulation region, the conductive sealant is disposed in the second encapsulation region, and wherein providing a sealant component comprising conductive sealant and insulating sealant on the array substrate and/or the color filter substrate for connecting the array substrate and the color filter substrate comprises:

in the second encapsulation region of the array substrate, forming the conductive sealant on a surface of the insulating sealant; or,     in the second encapsulation region of the array substrate, forming the conductive sealant outside the insulating sealant.

\* \* \* \* \*